United States Patent
Yu et al.

(10) Patent No.: US 8,958,027 B2
(45) Date of Patent: Feb. 17, 2015

(54) BACKPLATE ASSEMBLY AND LIQUID CRYSTAL DISPLAY DEVICE USING THE SAME

(71) Applicant: Shenzhen China Star Optoelectronics Technology Co., Ltd., Shenzhen, Guangdong (CN)

(72) Inventors: Gang Yu, Guangdong (CN); Xi Yang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 198 days.

(21) Appl. No.: 13/811,127

(22) PCT Filed: Oct. 12, 2012

(86) PCT No.: PCT/CN2012/082822
§ 371 (c)(1),
(2) Date: Jan. 22, 2013

(87) PCT Pub. No.: WO2014/026428
PCT Pub. Date: Feb. 20, 2014

(65) Prior Publication Data
US 2014/0055712 A1 Feb. 27, 2014

(30) Foreign Application Priority Data
Aug. 17, 2012 (CN) .............................. 201210294781

(51) Int. Cl.
*G02F 1/1335* (2006.01)
*H05K 7/18* (2006.01)
*F21V 8/00* (2006.01)

(52) U.S. Cl.
CPC ............ *G02F 1/133608* (2013.01); *H05K 7/18* (2013.01); *G02B 6/0088* (2013.01)
USPC .......................................................... 349/58

(58) Field of Classification Search
None
See application file for complete search history.

(56) References Cited

U.S. PATENT DOCUMENTS

2009/0207335 A1* 8/2009 Lee .................................. 349/58
2010/0201906 A1* 8/2010 Fukayama et al. .............. 349/58

FOREIGN PATENT DOCUMENTS

| CN | 1584706 | A | 2/2005 |
| CN | 2906678 | Y | 5/2007 |
| CN | 101051138 | A | 10/2007 |
| CN | 101149534 | A | 3/2008 |
| CN | 201145767 | Y | 11/2008 |
| CN | 201173408 | Y | 12/2008 |

(Continued)

*Primary Examiner* — Thanh-Nhan P Nguyen
(74) *Attorney, Agent, or Firm* — Muncy, Geissler, Olds & Lowe, P.C.

(57) ABSTRACT

A backplate assembly for accommodating and positioning an optical unit, comprising: a backplate, a plurality of cone-shaped holes, and a plurality of positioning columns. The backplate includes a plate and a vertical lateral side which vertically surrounds the plate. The cone-shaped holes are formed in the backplate. The positioning columns are protruding from the first surface for positioning the optical unit. Each positioning column has a column body part and a ring-shaped head part forming on an end of the column body. An external diameter of the ring-shaped head part is smaller than a diameter of the column body. The ring-shaped head part of each optical unit column inserts into each cone-shaped hole through the first opening by an external force and engages with the cone-shaped hole, such that the positioning column is fixed in the backplate.

11 Claims, 6 Drawing Sheets

(56) References Cited

FOREIGN PATENT DOCUMENTS

| | | |
|---|---|---|
| CN | 101363597 A | 2/2009 |
| CN | 101672991 A | 3/2010 |
| CN | 101699156 A | 4/2010 |
| CN | 101709841 A | 5/2010 |
| CN | 201828745 U | 5/2011 |
| CN | 102182989 A | 9/2011 |
| CN | 102192448 A | 9/2011 |
| CN | 202149421 U | 2/2012 |
| CN | 102537866 A | 7/2012 |
| CN | 102563468 A | 7/2012 |
| JP | 2000-19512 A | 1/2000 |
| JP | 2004-319294 A | 11/2004 |

* cited by examiner

BACKPLATE ASSEMBLY AND LIQUID CRYSTAL DISPLAY DEVICE USING THE SAME

FIELD OF THE INVENTION

The present invention relates to a backplate assembly and a liquid crystal display device using the same, and more particular to a backplate assembly in which a distance between a positioning column for fixing an optical unit and a lateral side of a backplate approaches zero such that the backplate assembly has a slim bezel, and a liquid crystal display device using the same.

BACKGROUND OF THE INVENTION

In the field of liquid crystal display devices, it is a future trend to slim the bezel of the liquid crystal display device. Therefore, in the fabricating process of a backlight module of the liquid crystal display device, it is very important how to expand a view area of the backlight module and reduce a bezel of the backlight module. In an edge-illumination type backlight unit, the light guide plate is a very important optical member. The type of positioning for light guide plates can affect the bezel thickness of the liquid crystal display device. In general, a positioning column is used for fixing light guide plates, wherein the positioning column is fixed in the backplate of the backlight module by many fabricating methods, and a press riveting method is the most common one.

In the press riveting process, a riveting die is fixed on the punching machine, and a hole is form in a metal sheet. The metal sheet is disposed on a female mold with draw holes, the hole on the metal sheet is corresponding to an inner hole of the female mold, and the diameter of the hole on the sheet metal is identical to the diameter of the inner hole of female mold. Then, the positioning column to be press riveted is disposed in the hole of the sheet metal. Finally, the positioning column is riveted in the metal sheet by punching. After finishing the press riveting process, the metal sheet is taken off from the mold.

Referring to FIGS. 1 and 2, FIG. 1 illustrates a structure view according to a conventional backplate assembly 1. FIG. 2 illustrates a cross-sectional and enlarged view of a positioning column 12 of the conventional backplate assembly 1 along line A-A of FIG. 1.

A backplate assembly 1 is used to accommodate and position an optical unit 2. The backplate assembly 1 comprises a backplate 10, a plurality of step-shaped holes 11, and a plurality of positioning column 12.

The backplate 10 has a plate 101 and a vertical lateral side 102. The plate 101 has a first surface 1011 and a second surface 1012. The vertical lateral side 102 vertically surrounds the plate 101. The step-shaped holes 11 are formed in the backplate 10, and the step-shaped hole 11 has a first opening 111, a second opening 112, and a ring step concave part 113. The first opening 111 is formed in the first surface 1011, the second opening 112 is formed in the second surface 1012. The ring step concave part 113 is formed between the first opening 111 and the second opening 112, and the first opening 111 is smaller than the second opening 112.

Each positioning column 12 has a column body part 121 and a ring-shaped shoulder part 122. The column body part 121 has a positioning function for positioning an optical unit 2, wherein the optical unit 2 has a plurality of positioning parts 21 corresponding to each column body part 121. Each ring-shaped shoulder part 122 is formed on an end of each column body part 121. Firstly, each column body part 121 of the positioning column 12 penetrates into the second opening 112, and passes through the corresponded first opening 111.

Then, each positioning column 12 is riveted into the plate 101 by punching, wherein the ring-shaped shoulder part 122 of each positioning column 12 and the ring step concave part 113 of the step-shaped hole 11 are closely combined to each other, such that each positioning column 12 is fixed in the backplate 10. The diameter of the column body part 121 of each positioning column is referred to as D1, and the diameter of the ring-shaped shoulder part 122 of each positioning column 12 is referred to as D2.

During a fabricating process of the backplate assembly 1, each positioning column 12 is riveted into the plate 101 by press riveting, and then a part of plate 101 is bent to form the vertical lateral side 102. If the second opening 112 is too close to or beyond the bending area of the plate 101, the second opening 112 and the ring-shaped shoulder part 122 of the positioning column 12 are deformed due to the bending movement for forming the vertical lateral side 102. Therefore, if it is anticipated that the column body part 121 of the positioning column 12 can be very close to the vertical lateral side 102; that is, if a distance L1 between the column body part 121 and the vertical lateral side 102 is approaching zero, the diameter D2 of the ring-shaped shoulder part 122 should be smaller than or equal to the diameter D1 of the column body part 121, such that the second opening 112 can't contact with the bending area of the plate 101 for forming the vertical lateral side 102.

The bezel thickness of liquid crystal display device is determined by a distance between the largest view area and the vertical lateral side 102, and the largest view area of the optical unit 2 is limited to the distance between the column body part 121 of each positioning column 12 and the vertical lateral side 102. When the distance L1 between the column body part 121 and the vertical lateral side 102 can't be reduced, the largest view area of the optical unit 2 is unable to be enlarged, such that the bezel thickness of the liquid crystal display device can't be reduced.

SUMMARY

One objective of the present invention is directed to a backplate assembly in which a distance between a positioning column for positioning an optical unit and a vertical lateral side is reduced, such that the bezel of the backplate assembly can be slimmed.

Another objective of the present invention is directed to a liquid crystal display device which includes a backplate assembly in which a distance between a positioning column for positioning an optical unit and a vertical lateral side is reduced, such that the bezel of the backplate assembly can be slimmed.

The present invention provides a backplate assembly for accommodating and positioning an optical unit. The backplate assembly comprises a backplate, a plurality of cone-shaped holes, and a plurality of positioning columns. The backplate includes a plate and a vertical lateral side which vertically surrounds to the plate. The plate has a first surface and a second surface corresponding to the first surface. The cone-shaped holes are formed in the backplate, wherein each cone-shaped hole has a first opening and a second opening, the first opening is formed in the first surface, the second opening is formed in the second surface, and the first opening is smaller than the second opening.

Each positioning column protrudes from the first surface for positioning the optical unit; each positioning column has a column body part and a ring-shaped head part forming on an end of the column body; an external diameter of the ring-shaped head part is smaller than a diameter of the column body; the ring-shaped head part of each optical unit column inserts into each cone-shaped hole through the first opening; the ring-shaped head part is deformed outward by an external force so as to engage with the cone-shaped hole, such that the positioning column is fixed in the backplate; and the external diameter of the deformed ring-shaped head part is smaller than the diameter of the column body part.

In one embodiment, the positioning columns at least include an anchor rivet bolt, and the deformed ring-shaped head is engaged with the plate by an anchor rivet joint.

In one embodiment, the positioning columns at least include an anchor rivet bolt, and the deformed ring-shaped head is engaged with the plate by a rotating rivet joint.

In one embodiment, the optical unit is a light guiding plate.

In one embodiment, a distance between the column part and the vertical lateral side is approaching zero.

The present invention provides a liquid crystal display device, comprising a liquid crystal module and a backlight module. The backlight module has a backplate assembly and an optical unit, wherein the backplate assembly comprises: a backplate, a plurality of cone shaped holes, and a plurality of positioning columns. The backplate includes a plate and a vertical lateral side which vertically surrounds the plate. The plate has a first surface and a second surface corresponding to the first surface. The cone-shaped holes are formed in the backplate, wherein each cone-shaped hole has a first opening and a second opening, the first opening is formed in the first surface, the second opening is formed in the second surface, and the first opening is smaller than the second opening.

Each positioning column protrudes from the first surface for positioning the optical unit. Each positioning column has a column body part and a ring-shaped head part forming on an end of the column body. An external diameter of the ring-shaped head part is smaller than a diameter of the column body. The ring-shaped head part of each optical unit column inserts into each cone-shaped hole through the opening. The ring-shaped head part is deformed outward so as to engage with the cone-shaped hole, such that the positioning column is fixed in the backplate. And the external diameter of the deformed ring-shaped head part is smaller than the diameter of the column body part.

In one embodiment, the positioning columns at least include an anchor rivet bolt, and the deformed ring-shaped head is engaged with the plate by an anchor rivet joint.

In one embodiment, the positioning columns at least include an anchor rivet bolt, and the deformed ring-shaped head is engaged with the plate by a rotating rivet joint.

In one embodiment, the optical unit is a light guiding plate.

In one embodiment, a distance between the column part and the vertical lateral side is approaching zero.

As the foregoing, the effect of the backplate assembly and the liquid crystal display device of the present invention lies in that: the ring-shaped head part is deformed outward so as to engage with the cone-shaped hole, such that the positioning column is fixed in the backplate; in addition, the external diameter of the deformed ring-shaped head part is smaller than the diameter of the column body part. Thereby, the distance between the column part and the vertical lateral side is approaching zero, such that the bezel of the liquid crystal display device can has slimmed.

The previous description of the present invention is only a schematic and brief illustration provided to enable a better understanding of the technical solution of the invention and to allow the practice of the invention according to the description. Hereinafter, the preferred embodiment of the present invention will be described in detail with reference to the accompanying drawings.

DETAILED DESCRIPTION

Now, the preferred embodiment of the present invention will be described in detail with reference to the accompanying drawings.

Figure 1:
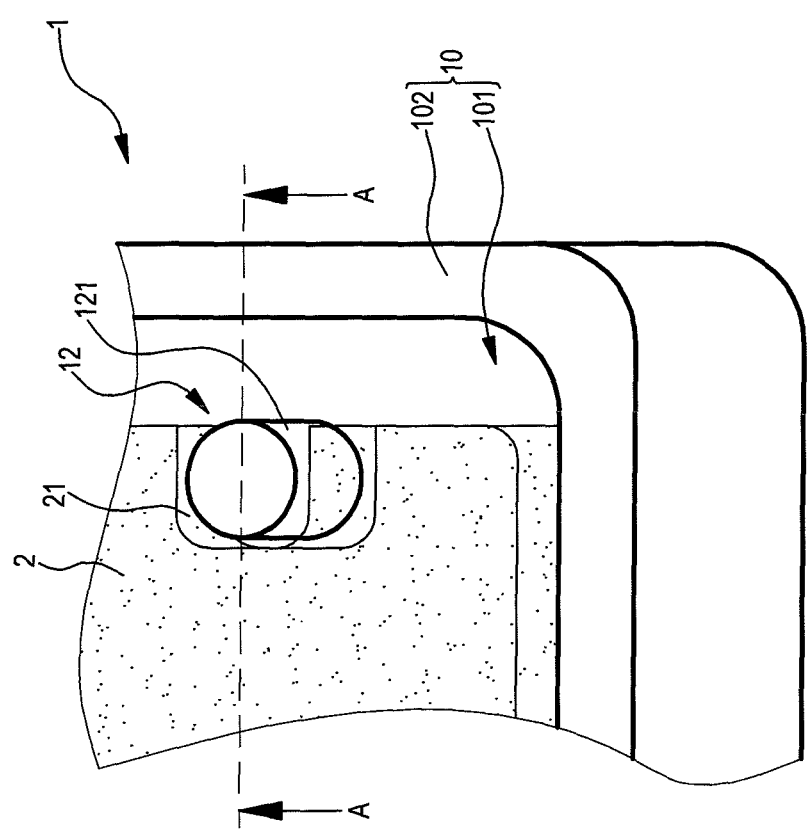
FIG. 1 illustrates a structure view according to a conventional backplate assembly.
Figure 2:
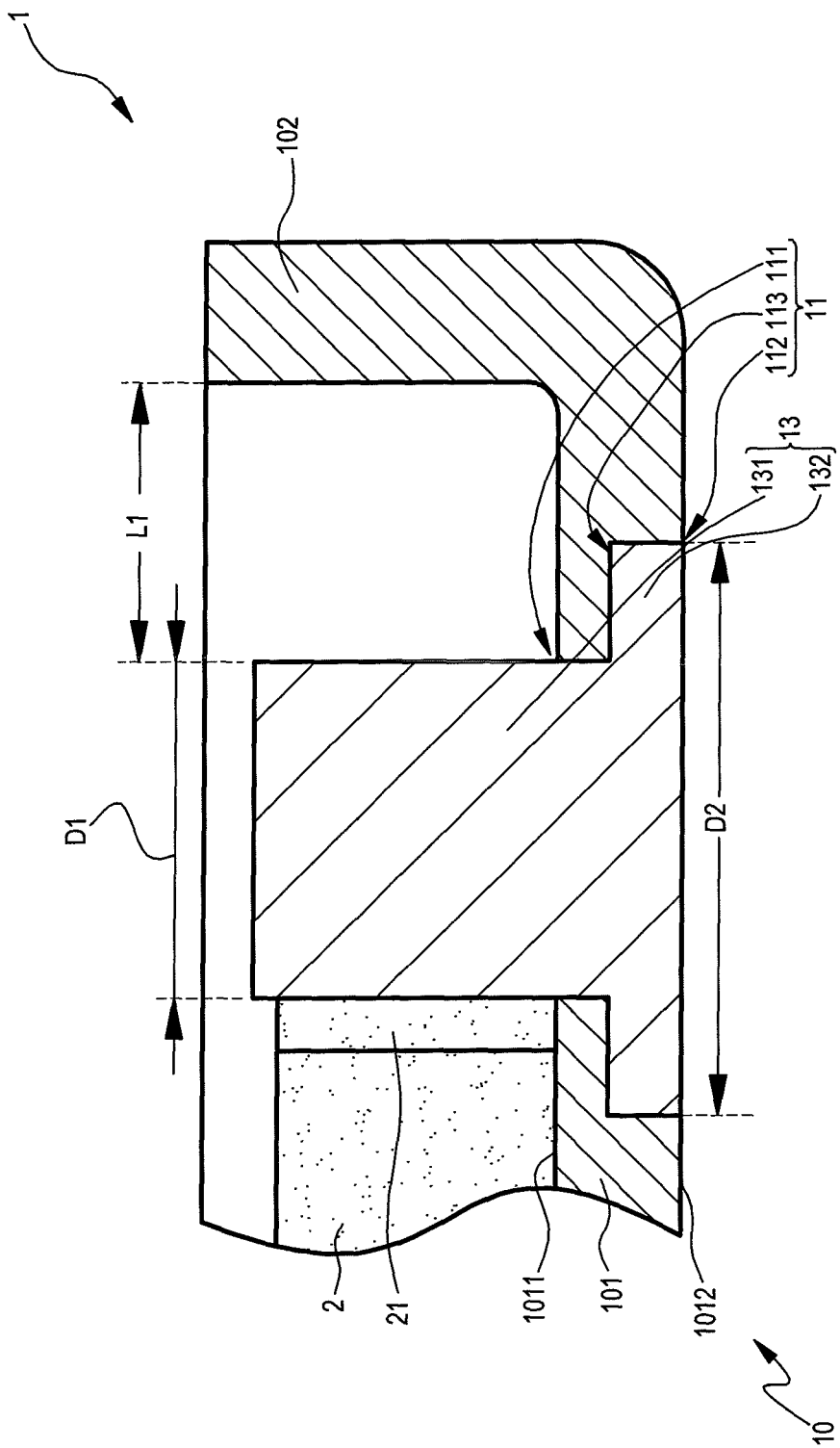
FIG. 2 illustrates a cross-sectional and enlarged view of a positioning column of the conventional backplate assembly along line A-A of FIG. 1.
Figure 3:
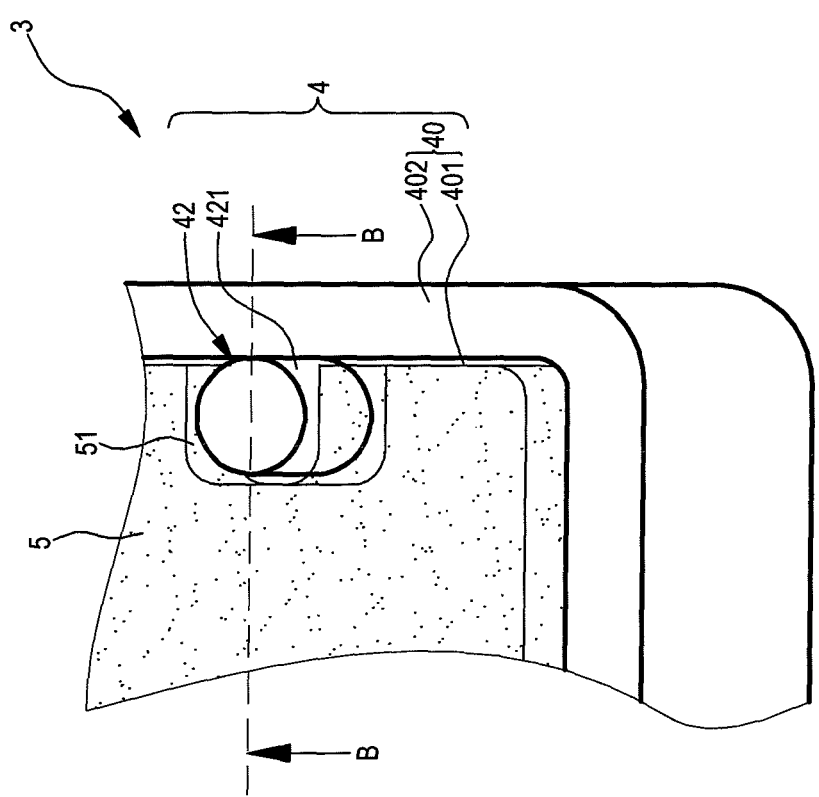
FIG. 3 illustrates a structure view a backplate assembly according to the present invention.
Figure 4:
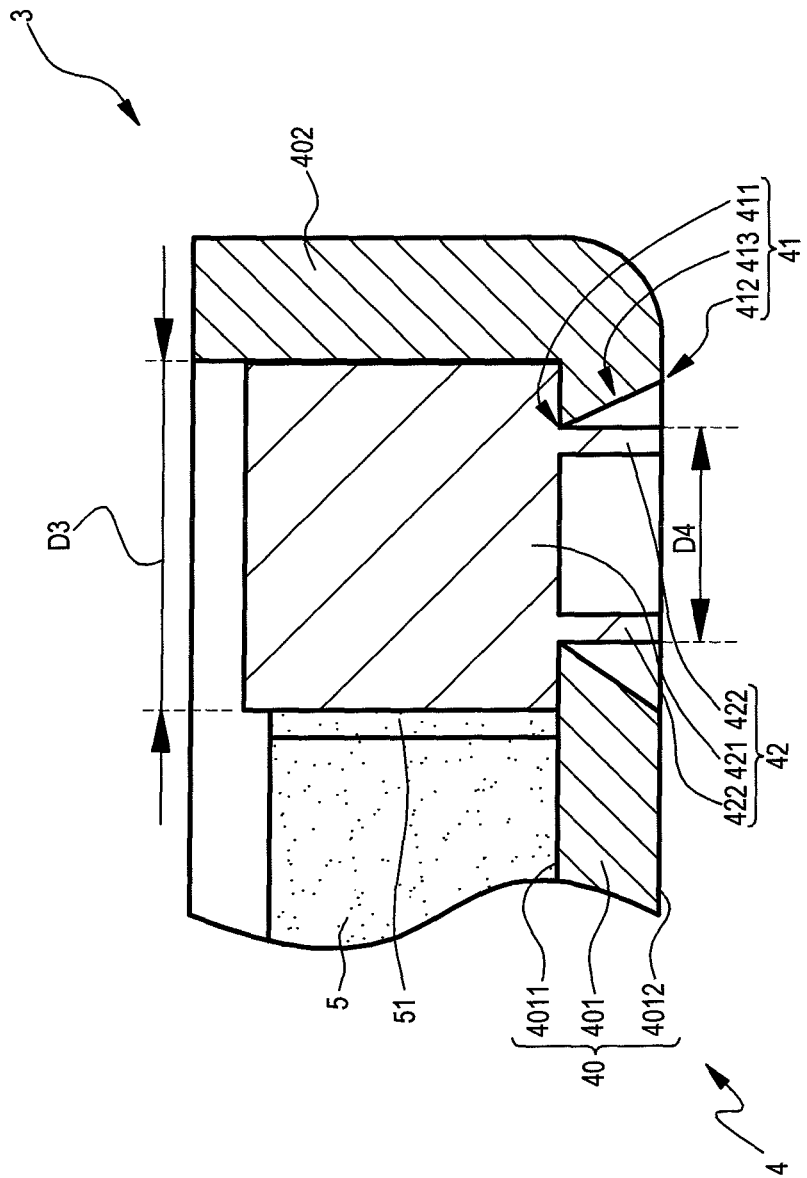
FIG. 4 illustrates a cross-sectional view of a positioning column of the backplate assembly of the present invention along line B-B of FIG. 3 before a ring-shaped head part of the positioning column is deformed outward.

Referred to FIGS. 3 and 4, FIG. 3 illustrates a structure view a backplate assembly according to the present invention. FIG. 4 illustrates a cross-sectional view of a positioning column of the backplate assembly of the present invention along line B-B of FIG. 3 before a ring-shaped head part of the positioning column is deformed outward.

A partial structure of a backlight module 3 is shown in figure. The backlight module 3 comprises a backplate assembly 4 and an optical unit 5. Firstly, the backplate assembly 4 is used for accommodating and positioning the optical unit 5, and the backplate assembly 4 includes: a backplate 40, a plurality of cone-shaped holes 41 and a plurality of positioning columns 42.

The backplate 40 includes: a plate 401 and a vertical lateral side 402. The plate 401 has a first surface 4011 and a second surface 4012, and the second surface 4012 is corresponding to the first surface 4011. The vertical lateral side 402 vertically surrounds the plate 401.

The cone-shaped holes 41 are formed in the plate 401, and each cone-shaped hole 41 has a first opening 411, a second opening 412, and a cone-shaped wall 413. Each first opening 411 is formed in the first surface 4011 of the plate 401, and each second opening 412 is formed in the second surface 4012 of the plate 401. Each first opening 411 is smaller than each second opening 412. Each wall 413 of the cone-shaped hole 41 is formed to penetrate through the first opening 411 and the second opening 412.

Each positioning column 42 protrudes from the first surface 4011 for positioning the optical unit 5. Each positioning column 42 has a column body 421 and a ring-shaped head part 422. The ring-shaped head part 422 is formed on an end surface of the column body part 421, and an external diameter D4 of each ring-shaped head part 422 is small than a diameter D3 of each column body 421. The ring-shaped head part 422 of each positioning column 42 inserts into each cone-shaped hole 41 through the first opening 411, and an end surface of each column body part 421 which is formed with the ring-shaped head part is disposed on the first surface 4011.

Figure 5:
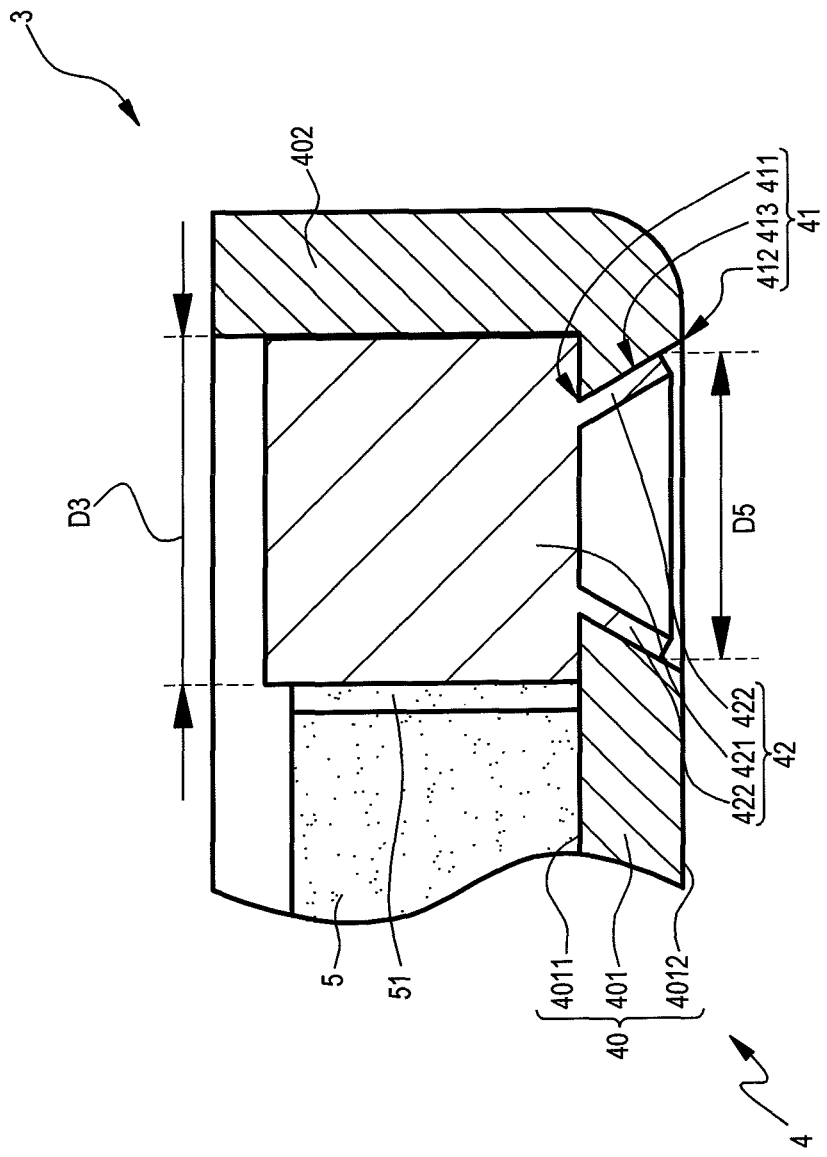
FIG. 5 illustrates a cross-sectional view of a positioning column of the backplate assembly of the present invention along line B-B of FIG. 3 after a ring-shaped head part of the positioning column is deformed outward.

Then, referring to FIG. 5, the ring-shaped head part is deformed outward by an external force so as to engage with the wall 413 of the cone-shaped hole 41, such that the positioning column 42 is fixed in the plate 401. And the diameter D5 of the deformed ring-shaped head part 422 is smaller than the diameter D3 of the column body part 421.

The deformed ring-shaped head 422 is engaged with the plate by an anchor rivet joint or a rotating rivet joint, and the positioning column 42 includes an anchor rivet bolt.

Because the external diameter D5 of each deformed ring-shaped head part 422 is smaller than the diameter D3 of each column body part 421, a distance between each column body part 421 and the vertical lateral side 402 is approaching zero. Thereby, each positioning column can closer to the vertical lateral side 402. The optical unit 5 has a plurality of positioning parts 51, wherein a position of each positioning part 51 is corresponding to a position of positioning column 42. The optical unit 5 can be fixed in the backplate assembly 4 by using the positioning parts 51 and the positioning columns 42. Wherein, the optical unit 5 may be a light guiding plate or a diffusing plate.

Figure 6:
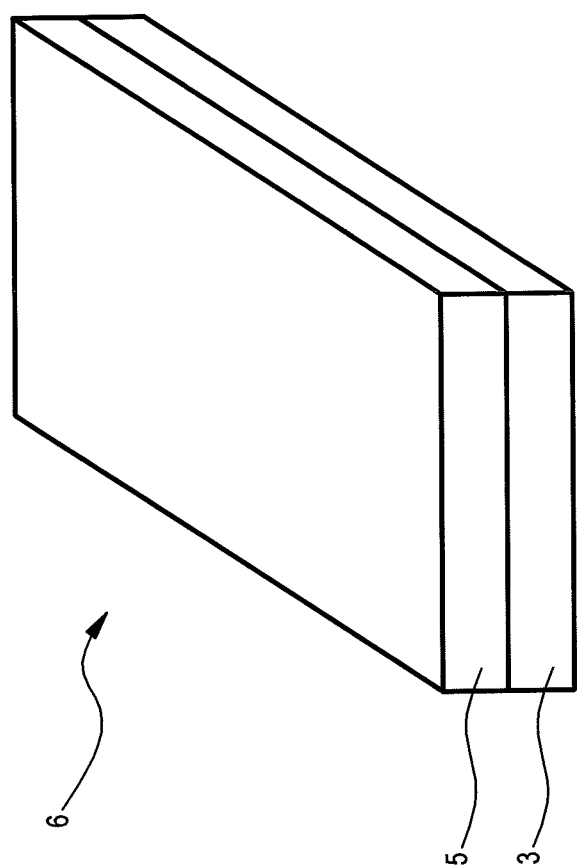
FIG. 6 illustrates a view according to a liquid crystal display device of the present invention.

FIG. 6 illustrates a view according to a liquid crystal display device of the present invention. The liquid crystal display device 6 includes a liquid crystal module 7 and the backlight module 3 comprising the above-mentioned backplate assembly 4.

As the foregoing, in the backplate assembly 4 and the liquid crystal display device 6 of the present invention, the ring-shaped head part 422 of each positioning columns 42 is deformed outward by an external force so as to engage with the wall 413 of the cone-shaped hole 41, such that the positioning column 42 is fixed in the plate 401; the diameter D5 of the deformed ring-shaped head part 422 is smaller than the diameter D3 of the column body part 421, such that the distance between the column body part 421 and the vertical lateral side 402 is approaching zero. Thereby, the liquid crystal display device 6 can have a slim bezel.

The previous description of the preferred embodiment is provided to further describe the present invention, not intended to limit the present invention. Any modification apparent to those skilled in the art according to the disclosure within the scope will be construed as being included in the present invention.

What is claimed is:

1. A backplate assembly for accommodating and positioning an optical unit, comprising:
   a backplate, including a plate and a vertical lateral side which vertically surrounds the plate; the plate has a first surface and a second surface corresponding to the first surface;
   a plurality of cone-shaped holes, formed in the backplate, wherein each cone-shaped hole has a first opening and a second opening, the first opening is formed in the first surface, the second opening is formed in the second surface, and the first opening is smaller than the second opening; and
   a plurality of positioning columns, protruding from the first surface for positioning the optical unit; each positioning column has a column body part and a ring-shaped head part forming on an end of the column body; an external diameter of the ring-shaped head part is smaller than a diameter of the column body; the ring-shaped head part of each optical unit column inserts into each cone-shaped hole through the first opening; the ring-shaped head part is deformed outward by an external force so as to engage with the cone-shaped hole, such that the positioning column is fixed in the backplate; and the external diameter of the deformed ring-shaped head part is smaller than the diameter of the column body part,
   wherein the positioning columns at least includes an anchor rivet bolt, and the deformed ring-shaped head is engaged with the plate by an anchor rivet joint or a rotating rivet joint, the optical unit is a light guiding plate, and a distance between the column part and the vertical lateral side is approaching zero.

2. A backplate assembly for accommodating and positioning an optical unit, comprising:
   a backplate, including a plate and a vertical lateral side which vertically surrounds the plate; the plate has a first surface and a second surface corresponding to the first surface;
   a plurality of cone-shaped holes, formed in the backplate, wherein each cone-shaped hole has a first opening and a second opening, the first opening is formed in the first surface, the second opening is formed in the second surface, and the first opening is smaller than the second opening; and
   a plurality of positioning columns, protruding from the first surface for positioning the optical unit; each positioning column has a column body part and a ring-shaped head part forming on an end of the column body; an external diameter of the ring-shaped head part is smaller than a diameter of the column body; the ring-shaped head part of each optical unit column inserts into each cone-shaped hole through the first opening; the ring-shaped head part is deformed outward by an external force so as to engage with the cone-shaped hole, such that the positioning column is fixed in the backplate; and the external diameter of the deformed ring-shaped head part is smaller than the diameter of the column body part.

3. The backplate assembly of claim 2, wherein the positioning columns at least includes an anchor rivet bolt, and the deformed ring-shaped head is engaged with the plate by an anchor rivet joint.

4. The backplate assembly of claim 2, wherein the positioning columns at least includes an anchor rivet bolt, and the deformed ring-shaped head is engaged with the plate by a rotating rivet joint.

5. The backplate assembly of claim 2, wherein the optical unit is a light guiding plate.

6. The backplate assembly of claim 2, wherein a distance between the column part and the vertical lateral side is approaching zero.

7. A liquid crystal display device, comprising a liquid crystal module and a backlight module having a backplate assembly and an optical unit, wherein the backplate assembly comprises:
   a backplate, including a plate and a vertical lateral side which vertically surrounds the plate; the plate has a first surface and a second surface corresponding to the first surface;
   a plurality of cone-shaped holes, formed on the backplate, wherein each cone-shaped hole has a first opening and a second opening, the first opening is formed in the first surface, the second opening is formed in the second surface, and the first opening is smaller than the second opening; and
   a plurality of positioning columns, protruding from the first surface for positioning the optical unit; each positioning column has a column body part and a ring-shaped head part forming on an end of the column body; an external diameter of the ring-shaped head part is smaller than a diameter of the column body; the ring-shaped head part of each optical unit column inserts into each cone-shaped hole through the opening; the ring-shaped head part is deformed outward so as to engage with the cone-shaped hole, such that the positioning column is fixed in the backplate; and the external diameter of the deformed ring-shaped head part is smaller than the diameter of the column body part.

8. The liquid crystal display device of claim 7, wherein the positioning columns at least include an anchor rivet bolt, and the deformed ring-shaped head is engaged with the plate by an anchor rivet joint.

9. The liquid crystal display device of claim 7, wherein the positioning columns at least include an anchor rivet bolt, and the deformed ring-shaped head is engaged with the plate by a rotating rivet joint.

10. The liquid crystal display device of claim 7, wherein the optical unit is a light guiding plate.

11. The liquid crystal display device of claim 7, wherein a distance between the column part and the vertical lateral side is approaching zero.

* * * * *